United States Patent [19]
Holmes et al.

[11] Patent Number: 5,770,324
[45] Date of Patent: Jun. 23, 1998

[54] METHOD OF USING A HOT PRESSED SILICON CARBIDE DUMMY WAFER

[75] Inventors: Thomas M. Holmes, Grafton; John A. Tomanovich, Paxton, both of Mass.

[73] Assignee: Saint-Gobain Industrial Ceramics, Inc., Worcester, Mass.

[21] Appl. No.: 805,843

[22] Filed: Mar. 3, 1997

[51] Int. Cl.$^6$ .............................. B32B 9/00; B32B 19/00
[52] U.S. Cl. ........................... 428/688; 264/60; 423/345; 427/255; 501/88
[58] Field of Search ............................... 501/88; 264/60; 423/345; 428/688; 427/255

[56] References Cited

U.S. PATENT DOCUMENTS

| | | | |
|---|---|---|---|
| 3,495,939 | 2/1970 | Forrest | 23/208 |
| 3,836,673 | 9/1974 | Weaver et al. | 423/345 |
| 4,346,049 | 8/1982 | Coppola et al. | 264/65 |
| 4,525,429 | 6/1985 | Kaiser et al. | 264/614 X |
| 4,587,928 | 5/1986 | Yonezawa et al. | 118/500 |
| 4,619,798 | 10/1986 | Tanaka et al. | 264/62 |
| 4,761,134 | 8/1988 | Foster | 432/253 |
| 4,998,879 | 3/1991 | Foster et al. | 432/253 |
| 5,302,561 | 4/1994 | Ezis | 501/89 |
| 5,589,116 | 12/1996 | Kojima et al. | 501/88 X |

FOREIGN PATENT DOCUMENTS

| | | |
|---|---|---|
| 340802 A2 | 11/1989 | European Pat. Off. . |
| 5-283306 | 10/1993 | Japan . |
| 2130192 | 5/1984 | United Kingdom . |

OTHER PUBLICATIONS

J.N. Ness, T.F. Page, "Microstructural Evolution in Reaction–Bonded Silicon Carbide", *J. Mat. Sci.*, vol. 21, No. 4 (1986) pp. 1377–1397.

C.B. Lim, T. Yano, T. Iseki, "Microstructure And Mechanical Properties Of RB–SiC/MoSi$_2$ Composite", *J. Mat. Sci.*, vol. 24 (1989) pp. 4144–4151.

Robert P. Messner, Yet–Ming Chiang, "Liquid–Phase Reaction–Bonding Of Silicon Carbide Using Alloyed Silicon–Molybdenum Melts", *J. Am. Ceram. Soc.*, vol. 73 (5) (1990), pp. 1193–1200.

Chiu, Marty et al, *Reduction of Metallic Contamination with the CVD Coating on the SIC Furnace Tube*, pp. 338–346, no date.

Foster, B.D. et al, *Silicon Processing with Silicon Carbide Furnace Components*, Reprinted from Solid State Technology, Copyright Oct. 1984, pp. 1–4.

Hattori, Takeshi, *Contamination Control: Problems and Prospects*, Jul. 1990 Solid State Technology, pp. 1–8.

Hockett, R.S., *Analysis of Trace Impurities on Wafers from Cleaning*, Semiconductor Cleaning Technology/1989, pp. 226–243.

Itsumi, Manabu, *Contamination Determination for Silicon Carbide Contilever Forks in Diffusion Furnaces*, J. Electrochem, Soc., vol. 141, No. 5, May 1994, pp. 1304–1308.

Japan New Materials Report, The Newsletter of the Japanese New Materials Industry, vol. VIII, No. 1, Jan.–Feb., 1993, pp. 4–6.

Kazakov, V.K. et al, *Multiple Study of Silicon Carbide Purity*, Copyright 1994 by Allerton Press, Inc., pp. 26–28.

Reisman, A. et al, *Differences in Surface Erosion of Silicon Wafers Annealed in "Si–Loaded," Sic–Coated and Pure Sic Carriers*, J. Electrochem. Soc., vol. 138, No. 5, May 1991, pp.1–3.

Ruzyllo, Jerzy, *Evaluation of Wafer Cleaning Through Electrical Characterization*, An Intensive Course: "Semiconductor of Wafer Cleaning Technology", Feb. 23–24, 1993, Austin, Texas.

Schmidt, Paul F., *Furnace Contamination and its Remedies*, Solid State Technology/Jun. 1983, pp. 147–151.

Sugino, R. et al, *UV–Excited Dry Cleaning of Silicon Surfaces Contaminated with Iron and Aluminum*, Proceedings of the Second International Symposium on Cleaning Technology in Semiconductor Device Manufacturing, Electronics and Dielectric Science and Technology Div., Proceedings vol. 92–12, pp. 72–79, no date.

Suzuki, K., *Pressureless Sintering of Silicon Carbide with Addition of Aluminum Oxide*, Reports Res. Lab. Asahi Glass Co., Ltd., 36[1] (1986) pp. 25–36.

Watanabe, Masaharu, *Technical Trends in Large Diameter Silicon Wafers: Part II*, Apr. 1991 Solid State Technology, pp. 133–141.

*Primary Examiner*—Michael Lusignan
*Attorney, Agent, or Firm*—Thomas M. DiMauro

[57] ABSTRACT

This invention relates to hot pressed silicon carbide dummy wafers having low iron impurity levels, and a method of using hot pressed silicon carbide dummy wafers in silicon wafer processing applications.

49 Claims, No Drawings

METHOD OF USING A HOT PRESSED SILICON CARBIDE DUMMY WAFER

BACKGROUND OF THE INVENTION

The manufacture of semi-conductor devices typically requires high temperature processing such as diffusion, oxidation and deposition. In deposition processes, dielectric materials such as polycrystalline silicon, silicon nitride and silicon dioxide are deposited on the surfaces of thin silicon wafers. In diffusion processes, materials are diffused into the body of the silicon wafer. In oxidation processes, the surface of the silicon wafer is oxidized to form a silica layer. These processes each typically involve rapid heating and cooling cycles in an electrically heated furnace (or "diffusion process tube") at temperatures typically ranging from 250° C. to over 1200° C.

The silicon wafers in these processes are usually supported in vertical or horizontal boats placed within the process tube. The wafer boat and process tube are typically made of a material which has excellent thermal shock resistance, high mechanical strength, high purity, an ability to retain its shape through a large number of heating and cooling cycles, and which does not out-gas (i.e., introduce any undesirable impurities into the atmosphere of the kiln during firing operations). One material which meets these requirements is silicon carbide. For the above-mentioned application, silicon carbide diffusion components such as boats, paddles and process tubes are typically pre-coated with the dielectric selected for deposition.

When the silicon wafers are processed in a boat, it is naturally desirable that each wafer in the boat be exposed to identical gas concentration and temperature profiles in order to produce consistent coating thickness. However, the typical fluid dynamic situation is such that consistent profiles are found only in the middle of the boat while inconsistent profiles are often found at the ends of the boats, resulting in undesirable degrees of dielectric deposition upon the end-wafers which render them unusable.

One conventional method of mitigating this "end-effect" problem is to fill the end slots of the boat with sacrificial ("dummy") wafers made of silicon. However, it has been found that silicon wafers warp at high process temperatures, may flake particles due to a thermal expansion mismatch with deposited layers, and have a short useful life span which limits their cost effectiveness.

Another conventional method of mitigating the "end-effect" problem is to fill the end slots of the boat with dummy wafers made of alternative materials. For example, one investigator placed SiC-coated carbon wafers having the exact dimensions of the neighboring silicon wafers in the end slots. However, these wafers were found to break apart, contaminating the furnace with carbon particles. Another investigator proposed using CVD monolithic silicon carbide as a dummy wafer. However, this material is known to be very expensive.

One prior proposal for producing silicon carbide wafers is a freeze casting approach which produces a green silicon carbide billet which is recrystallized and then sliced to a commercially useful thickness. However, it has been found that the freeze casting process produces significant porosity in the wafer (on the order of 25 v/o, with 15 percent of the pores larger than 25 um). These large pores make it difficult to completely precoat the wafer with the dielectric (making the deposition process very expensive), provide a ready avenue for metallic impurities within the SiC body to escape and contaminate the neighboring silicon wafers, and hinder the vacuum transfer of the wafer. Although the pores of the freeze cast wafers could be partially filled by siliconization, dummy wafers with large amounts of silicon are considered undesirable for use in processes wherein polysilicon (which has been deposited on the silicon wafer) is etched, as the etchant also attacks the silicon in the dummy wafer. Also, the impregnated silicon only partially slows the diffusion of the metallic contaminants out of the SiC wafer.

Recrystallized silicon carbide dummy wafers made by tape casting have also been considered. However, the average pore size in these unsiliconized wafers (i.e., between about 6 um and 10 um) was also considered to be too large for economical pre-coating. Moreover, the open porosity of this wafer still required siliconization, and its siliconized version was found to have high warpage.

JP Patent Publication No. 5-283306 discloses forming a commercially useful wafer by grinding a 2 mm thick, siliconized silicon carbide disc to a thickness of about 0.625 mm, and then CVD coating the disc with an alumina-silica coating. However, the thickness of the CVD coating suggested in this publication (e.g., 20 um–200 um) greatly adds to the cost of the wafer.

As noted above, a basic requirement of the silicon carbide dummy wafer is that it must avoid transferring significant metallic impurities to the surface of the silicon wafers during semiconductor fabrication. Although the acceptable level of contamination generally varies with the different fabrication processes, the literature has on occasion provided some guidance as to what constitutes an acceptable level of contamination for the surface and bulk of a silicon wafer.

Regarding iron, Watanabe, Solid State Technology, April 1991, p.133–141 and Table VII, suggests that a useable silicon wafer should have no more than $10^{10}$ atoms/cm$^2$ of surface contamination from alkali and heavy metal elements, such as iron. More recently, Ruzyllo in Evaluation of Wafer Cleaning Through Electrical Characterization" in Semiconductor Wafer Cleaning Technology, (1993) set "ultraclean" requirements of $10^{10}$ atoms/cm$^2$ for surface metals and $10^{11}$ atoms/cm$^3$ for bulk metals. It is believed that higher levels of such metallic contamination result in reduction of minority carrier recombination and generation lifetimes, increased leakage current, and nucleation of oxidation induced stacking faults.

Regarding aluminum, Ruzyllo, suggests that a useable silicon wafer may have up to $10^{11}$ atoms/cm$^2$ of contamination from light metals such as aluminum. It is believed that higher levels of aluminum adversely affect the deposition rate of oxide films on the silicon wafer. See Hocket, Analysis of Trace Impurities on Wafers from Cleaning, in Proceedings of the First International Symposium on Cleaning Technology in Semiconductor Device Manufacturing (1989), pp. 227–242.

Sugino, "UV-excited Dry Cleaning of Silicon Surfaces Contaminated with Iron and Aluminum", in Proceedings of the Second International Symposium on Cleaning Technology in Semiconductor Device Manufacturing (1992), pp.72–79, considers a silicon wafer having $10^{13}$ atoms Fe/cm$^2$ and $10^{13}$ atoms Al/cm$^2$ to be "contaminated".

Conventional porous or silicon-impregnated recrystallized silicon carbide diffusion components typically have bulk impurity levels of only between about 3 ppm and 13 ppm of iron, and lesser amounts of alkali and other heavy metal elements. According to EP 0 340 802 A, iron is the material that will most contaminate a silicon carbide diffusion component, and controlling its contaminant level (e.g., 5 ppm) usually results in controlling the total amount of other detrimental impurities such as Ti, Cu, Mn, Mg and Ni to a similar level of contamination (i.e. 5 ppm). Conventional porous or silicon-impregnated recrystallized silicon carbide diffusion components typically have been reported to have only between about 1 ppm and 100 ppm of aluminum. See Japan New Materials Report, January–February 1993, p.6, and U.S. Pat. No. 4,998,879. JP Published Patent Application No. 6168900 states that it is preferable to have less than 1 ppm aluminum in a silicon carbide diffusion component.

Essentially all of the silicon carbide diffusion component literature relates to recrystallized silicon carbide which is usually only about 80–88% dense, has open porosity and is optionally impregnated with silicon. In these components, metals contaminants (which typically comprise less than about 200 ppm due the lack of sintering aid) are believed to migrate through its porosity or silicon phase to the component surface, vaporize and deposit upon the silicon wafer surface.

The art has generally disclosed two methods of managing the metallic contamination within silicon carbide diffusion components. The first method involves simply providing a thick 20–200 um dielectric ceramic barrier on the surface of the diffusion component, as in JP 5-283306 above, or as in Reisman, *J. Electrochem. Soc.* Vol. 138, No. 5 (1991), pp. L1-3 (a 25–50 um CVD SiC layer). U.S. Pat. Nos. 4,619, 798; 4,761,134; and 4,998,879 relate to silicon carbide diffusion components having CVD SiC layers with thicknesses of 100–300 um, 100 um and 25–250 um, respectively, which act as metal diffusion barriers. JP 0340 802 A teaches that if the thickness of this layer falls below 50 um, interception of impurities may become insufficient. U.S. Pat. No. 4,587,928 teaches that the silicon carbide layer should be at least 5 um in order to prevent impurity diffusion from the component to the semiconductor device, and is preferably between 80 and 300 um. Not only is CVD deposition expensive in such thick layers, the benefits of the deposited layer may be lessened by the high diffusivity of metallic contaminants through the CVD layer as the layer is deposited at high temperatures. Therefore, it is desirable to avoid the necessity of using a thick (i.e., more than 5 um) dielectric layer in order to prevent metal migration and attain the silicon wafer contaminant specification.

The art also sometimes provides the silicon carbide component with a much thinner 1–5 um CVD precoat of a dielectric such as $Si_3N_4$, $SiO_2$ or polysilicon which acts as an etch stop (i.e., prevents the etching of silicon in a silicon-impregnated component during acid cleaning).

The second method of managing the metallic contamination involves cleaning the surface of the diffusion component. Such cleaning operations can be usefully divided into two categories of increasing effectiveness. The basic level of cleaning is commonly called "wet" cleaning, and typically involves contacting the SiC body with conventional liquid solutions of acids and degreasers (e.g. SC1 or SC2 cleaning) at room temperature for ten minutes. Wet cleaning is routinely used and acts to remove contamination which adheres to the surface of the diffusion component. The second level of cleaning is commonly call "hot" cleaning and typically involves contacting the component with a gaseous cleaning fluid such as 1200° C. DCE or HCl, or 1000° C. steam for over an hour. See also UK Patent No. GB 2,130,192 B. Although the hot cleaning step is usually effective in reducing the amount of metallic contamination produced by the component, it is also significantly more expensive. In addition, hot cleaning only removes metallic contamination which is somewhat near the surface of the component. Since the high temperatures involved in wafer processing typically cause bulk impurities in the wafer to migrate to the component surface, hot cleaning is only a temporary solution and must be periodically repeated by the wafer fabricator in order to maintain the initial surface purity level. Accordingly, it is desirable to avoid the necessity of hot cleaning the silicon carbide diffusion component in order to meet the metal contamination specification for the silicon wafer.

Because silicon carbide materials of higher density typically have much higher levels of metallic contamination (due to the need for sintering aids and the lesser ability to volatilize these metals during densification), they have rarely been considered as diffusion components. However, some literature relating to higher density silicon carbide diffusion components is available. For example, Kazakov, in *Sverkhtverdye Materialy*, 16(1), pp. 28–30, (1994), studied the contamination effects of using hot pressed silicon carbide disks in semiconductor processing. Kazakov found moving charge (i.e., alkaline) contamination in the $SiO_2$ film deposited on the silicon to be on the the order of $10^{13}$ atoms/$cm^2$, and characterized this level of impurity as "considerable" and suggested that the primary source of contamination of the dummy lies in the charge preparation and hot pressing procedures. Kazakov discloses neither the temperature at which the silica film was grown, nor a CVD dielectric coating upon the silicon carbide disk, nor the extent to which any sintering aid in the disk produced contamination of the silicon wafer.

U.S. Pat. No. 4,619,798 ("Tanaka") discloses a CVD-coated sintered silicon carbide diffusion component having up to 2 wt % sintering aid. According to Tanaka, the higher density (i.e., greater than 95%) brought about by sintering prevents impurities from being discharged from the component. Despite the high density, Tanaka still teaches the necessity of a prolonged hot cleaning (of the green body) and a thick CVD layer (disclosed as between 100 um and 300 um) in order to meet the silicon wafer metallic contaminant specification. Tanaka does not discuss the extent to which the 2 wt % sintering aid in the disk was responsible for contamination of the silicon wafer.

Although more closely related to disk substrates, U.S. Pat. No. 5,302,561 ("Ezis") is also instructive. Ezis teaches that metal contaminants in a certain hot pressed silicon carbide have been observed to exist as discontinuous pools within the fully dense microstructure. Based upon this observation, Ezis concludes the metals are effectively inert to the environment, and suggests using dirty silicon carbide powders (i.e., up to 2 wt % iron and 2 wt % aluminum contamination) even for applications sensitive to metallic contamination.

One publicly available hot pressed silicon carbide dummy wafer has apparently followed the teachings of Ezis related to metallic contamination. This dummy wafer is made of a material which has a density of at least about 99% of theoretical density, contains about 1300 ppm iron, and about 6000 ppm aluminum. It is believed the material has a Weibull Modulus of about 5. This wafer has a 1–2 um thick dielectric layer thereon. This dummy wafer is believed to have broken during typical silicon wafer processing. The extent to which this wafer achieves metallic contaminant specifications for silicon wafer processing is not known.

Therefore, the art related to dense (i.e., greater than 90% of theoretical density) silicon carbide diffusion components can be summarized as follows. Even though the higher density of the material may reduce metallic migration by eliminating open porosity and silicon pathways, the higher level of metallic contamination appears to negate this benefit. In addition, it appears that:

a) highly dense diffusion components having no CVD layer thereon (e.g., Kazakov) fail to sufficiently control contaminant migration, b) attainment of metallic contamination specifications by these dense components are achieved only by requiring both extensive hot acid cleaning of the green body and a thick CVD layer (e.g., Tanaka), and c) there is a danger of breakage when the dense silicon carbide component is made in the shape of a dummy wafer.

Therefore, there is a need for a high density silicon carbide dummy wafer having closed porosity which can be used in at least some semiconductor fabrication processes without breaking and without having to either coat the wafer with a thick CVD coating or frequently hot clean its surface in order to prevent adverse iron or aluminum transfer to its neighboring silicon wafers.

SUMMARY OF THE INVENTION

In accordance with the present invention, there is provided a method of using a silicon carbide ceramic wafer, comprising the steps of:

a) providing a wafer boat having a plurality of slots configured for the insertion of wafers, a first slots having a silicon wafer inserted therein, a second slot having a silicon carbide dummy wafer inserted therein, the silicon carbide dummy wafer having a thickness of between about 0.3 mm and about 1.0 mm, preferably a diameter of at least 125 mm (more preferably at least 150 mm), closed porosity, a density of at least about 90% of theoretical density, and preferably a Weibull modulus of at least 8 (more preferably at least 10, most preferably at least 15), and further comprising:
  i) at least about 90 wt % silicon carbide grains, preferably wherein at least 10% of the silicon carbide grains have a diameter of at least 5 um,
  ii) less than 5 wt % free silicon,
  iii) preferably, an iron impurity content of no more than about 5 ppm (more preferably, no more than 2 ppm),
  iv) optionally, an aluminum content characterized by either:
    between about 5000 ppm and about 10,000 ppm total bulk aluminum (as detected by GDMS), and comprising metallic aluminum in an amount detectable by EDS, or
    between about 1000 ppm and about 5,000 ppm total bulk aluminum, the essential absence of metallic aluminum, as determined by EDS, and less than 500 ppm nitrogen (preferably less than 50 ppm), b) exposing the loaded boat to an environment having a temperature of between 300° C. and 900° C. (typically between 600° C. and 900° C.) for at least 0.5 hours (typically for multiple runs totaling between about 10 and about 100 hours).

Preferably, the ceramic wafer transfers no more than about $10^{10}$ atoms Fe/cm$^2$ and no more than about $10^{11}$ atoms Al/cm$^2$ to the silicon wafer during step b).

Preferably, step b) is performed without prior treatment of the ceramic wafer by a gaseous cleaning fluid, such as steam, HCl or DCE at temperatures of at least 1000° C.

In some embodiments, the ceramic wafer is substantially free of a thick CVD layer on its surface at the beginning of step b). In some of these embodiments, the ceramic wafer has a CVD (and preferably dielectric) layer on its surface having a thickness of between 0.1 and less than 5 um (typically between 0.1 and 0.5 um) at the beginning of step b), while in others the ceramic wafer has no CVD layer thereon prior to step b).

In some embodiments, step b) includes the step of depositing a CVD layer of a polysilicon upon the ceramic wafer having metallic aluminum therein, the deposition proceeding at a temperature of no more than about 825° C. so that the rate of deposition of the CVD layer exceeds the rate of diffusion of aluminum and iron impurities in the silicon carbide dummy wafer from the surface of the dummy wafer through the CVD layer being deposited thereon.

Also in accordance with the present invention, there is provided a sintered ceramic wafer having no more than about 5 wt % free silicon, a diameter of at least 150 mm, a thickness of between about 0.3 mm and about 1.0 mm, a density of at least about 90% of theoretical density, and closed porosity, the wafer comprising at least about 90 wt % silicon carbide grains, and a Weibull modulus of at least 8 (preferably at least 10, more preferably at least 15), and preferably wherein at least 10% of the silicon carbide grains have a diameter of at least 5 um.

Also in accordance with the present invention, there is provided a sintered ceramic wafer having less than 5 wt % free silicon, a thickness of between about 0.3 mm and 1.0 mm, a density of at least about 90% of theoretical density, and closed porosity, the wafer comprising at least about 90 wt % silicon carbide grains and having an iron impurity content of no more than about 5 ppm (preferably, no more than about 2 ppm, and more preferably no more than 1 ppm).

Also in accordance with the present invention, there is provided a sintered ceramic wafer having less than 5 wt % free silicon, a thickness of between about 0.3 mm and 1.0 mm, a density of at least about 90% of theoretical density, and closed porosity, the wafer comprising at least about 90 wt % silicon carbide grains and having an aluminum content characterized by either:

between about 5000 ppm and about 10,000 ppm total bulk aluminum (as detected by GDMS), and comprising metallic aluminum in an amount detectable by EDS, or between about 1000 ppm and about 5,000 ppm total bulk aluminum, the essential absence of metallic aluminum, as determined by EDS, and less than 500 ppm nitrogen (preferably less than 50 ppm).

DETAILED DESCRIPTION OF THE INVENTION

It was unexpectedly found that high density, hot pressed silicon carbide could be successfully used as a dummy wafer in semiconductor fabrication processing. This finding is surprising in five respects. First, it was found that residual stress-induced breakage of the wafer could be eliminated by providing a high Weibull modulus (to minimize residual stresses caused by either heterogeneities in the microstructure or flaws induced by surface grinding). Second, it was found that dummy wafers made from hot pressing with 2 wt % aluminum did not transfer unacceptably high levels of aluminum to neighboring silicon wafers even though they contained extremely large concentrations of total aluminum and metallic aluminum. It is believed that simply precoating these wafers with a thin CVD ceramic layer will allow the wafer to meet the aluminum transfer specification for silicon wafer processing without hot cleaning. Third, it was found that dummy wafers having no metallic aluminum transferred even lower levels of aluminum to neighboring silicon wafers, so that these wafers could be used in silicon wafer processing even without precoating. Fourth, it was found that controlling the amount of iron impurity in the dummy wafer at levels far below those of the publicly available dummy wafer is critical to its successful use in these applications. In particular, it was found that precoating a SiC dummy wafer having about 2 ppm iron with a 0.1–5 um CVD coating is a necessary and sufficient step for meeting the iron transfer specification in certain applications. In addition, in other applications, it was found that a 1 ppm maximum iron impurity in the dummy wafer appears to be critical to attaining acceptable levels of iron impurity transfer levels in the neighboring silicon wafers without having to either precoat the dummy wafer with a thin CVD layer or hot clean the dummy wafer. Fifth, it was found that a certain minimum amount of coarse grains appears to be critical in preventing breakage of the 125 mm dummy wafers during LPCVD process conditions.

As noted above, is was learned that publicly available 125 mm hot pressed silicon carbide dummy wafers consistently broke during LPCVD silicon wafer processing, and the fracture surface pattern on these wafers was very convoluted. In contrast, the wafers of the present invention having a minimum or coarse grains did not break. Intensive examination of one such broken publicly available wafer and its comparison against successfully-tested wafers of the present invention revealed a significant difference. Based upon Weibull characterization of unused wafers, it is believed that the broken publicly available possessed a low Weibull modulus of about 5. It is believed that when the Weibull modulus is less than about 8, either or both of the microstructure and surface of the dummy wafer is so heterogeneous as to cause significant residual stress in the dummy wafer. In contrast, the wafers of the present invention typically have a Weibull modulus of at least about 8. Accordingly, without wishing to be tied to a theory, it is believed that requiring a Weibull modulus of at least about 8 helps prevent breakage.

Densified silicon carbide dummy wafers having between about 2000 and 9000 ppm total aluminum and densities of between 97% and 100% of theoretical density were placed in simulated wafer processing environments and exposed to 900° C. temperatures for three hours under flowing nitrogen. It was found that some of these wafers broke during this test in clean straight fractures. Post-test analysis of the wafers revealed that the broken wafers were characterized by a smaller grain size. In particular, whereas wafers characterized by a $D_{90}$ of at least 5 um did not fail, wafers characterized by a $D_{90}$ of about 2 um failed about 50% of the time. Since conventional semiconductor fabricators would consider a 50% failure rate to be disastrous, it is believed that a certain minimum amount of coarse grains appear to be critical to making a densified SiC dummy wafer which can be successfully used in silicon wafer processing operations. Preferably, the wafer has an average SiC grain size $D_{50}$ of at least 3 um.

Without wishing to be tied to a theory, it is believed that wafers on the order of 0.3–1 mm thickness and greater than 125 mm in diameter should have excellent crack deflection capabilities in order to survive thermal shock, and the absence of the coarse grains lowers the crack deflection capabilities of these wafers.

It was also found that the high levels of aluminum in the densified ceramic did not adversely contaminate the neighboring silicon wafers. In particular, it was unexpectedly found that dense silicon carbide dummy wafers which were hot pressed with 1–2 wt % aluminum as a sintering aid did not produce unmanageable aluminum contamination of adjacent silicon test wafers. In one simulated silicon wafer processing environment wherein these hot pressed silicon carbide wafers and silicon wafers were exposed to a 900° C. nitrogen environment for three hours, aluminum contamination of the silicon wafers by the hot pressed silicon carbide wafers were between about $0.44 \times 10^{11}$ atoms/cm$^2$ and about $3.8 \times 10^{11}$ atoms/cm$^2$. Because the silicon carbide dummy wafers used in this simulation had only been subjected to basic-type cleaning, it is believed they would be deemed acceptable by customers in LPCVD applications by (at most) simply precoating a thin CVD ceramic layer thereon and without having to be further cleaned by hot cleaning fluids. It is believed this thin CVD layer reduces the aluminum transfer to the silicon wafer by a factor of about three.

This result was surprising in light of the high amounts of aluminum present in the sintered body, the comparatively low amounts of aluminum in conventional porous recrystallized diffusion components, the relatively strict transfer goal of $10^{11}$ atoms Al/cm$^2$ for aluminum, and the teaching of Tanaka (which requires hot cleaning and a thick CVD layer of the dense ceramic wafer).

Without wishing to be tied to a theory, it is believed the that only a portion of the metallic aluminum added to the silicon carbide powder remains in the metallic state when the blend is hot pressed. Some of this aluminum (about 5000–10,000 ppm) enters the silicon carbide lattice, while another portion (sometimes about 5000 ppm) is tied up in the grain boundaries as alumina or alumino-silicates. The remaining metallic aluminum (up to about 10,000 ppm) which is in the bulk of the closed porosity body can only slowly diffuse through the bulk of the densified silicon carbide. Accordingly, only the metallic aluminum present at the silicon carbide surface may be of concern. However, since diffusion data regarding the diffusion of aluminum through high temperature gaseous atmospheres appears to be unavailable, the extent to which the metallic aluminum at the surface of the silicon carbide could transfer to the silicon wafer could not reasonably be predicted.

Further examination of the hot pressed silicon carbide ceramics made from blends having about 2 wt % aluminum additive revealed a number of interesting findings. First, it was found that about half of the aluminum could not be accounted for in the dense ceramic body.

Second, examination of the remaining aluminum revealed the presence of several aluminum-containing phases located at the grain boundaries. The optical micrographs revealed both bright and dark gray phases in addition to some porosity. Characterization of the bright phases by energy dispersive spectroscopy (EDS) indicates that they primarily comprise silicon and aluminum, with lesser amounts of iron, titanium and vanadium.

Bright phase characterization by XRD identified the matrix as beta-silicon carbide and possibly some alpha-alumina. However, the identification of alumina was not conclusive due to the masking of major peaks by beta-silicon carbide, and the absence of several intermediate peaks. Although metallic aluminum was not identified by XRD, the detection limits of metallic aluminum by XRD, about 10,000 ppm), may have been too high to consider this finding useful.

Characterization of the bright phase by wavelength dispersive spectroscopy (WDS) revealed the strong presence of aluminum and silicon, with trace amounts of titanium, vanadium and carbon, and so is consistent with the EDS analysis. Characterization of the dark phase by WDS revealed the strong presence of Al, O and Si, with lesser amounts of C. These findings are summarized in Table I below:

TABLE I

|      | Bright phase |            | Dark phase |       |
|------|--------------|------------|------------|-------|
|      | major        | minor      | major      | minor |
| EDS  | Si, Al       | Fe, Ti, V  | —          | —     |
| WDS  | Si, Al       | Ti, V, C   | Al, O, Si  | C     |

These findings suggest the bright phase is metallic Al-Si, while the dark phase may be alumina or alumino-silicate. The phase diagram for metallic Al-Si indicates that Al and Si are completely soluble as a liquid, but little or no solubility exists at room temperature. Moreover, a eutectic solidification (which is known to occur upon cooling at 577° C. to produce a eutectic composition at 11.3% Si) would be expected to produce separate elemental aluminum and silicon phases upon solidification.

The above analyses suggest that the aluminum in the dark phase may be tied up (as alumina or alumino-silicates) while the aluminum in the bright phase is metallic. Since the diffusive capabilities of the metallic aluminum is much greater than that of the solubized or silicon/oxygen-tied aluminum, further experiments were conducted in order to reduce this metallic (bright phase) aluminum.

When the amount of aluminum additive was decreased to 1.5 wt % and 1.0 wt % of the SiC powder, a change in the relative concentrations of the bright and dark phases occurred. At 1.5 wt % aluminum addition, both bright and dark phases were seen, but there appeared to be a lower relative concentration of the bright (metallic) phase than in the microstructure made with 2 wt % aluminum addition. Moreover, the bright (metallic) phase was seen predominantly in the middle of the wafer while the dark phase was observed predominantly at the edges of the wafer. When the aluminum addition was further decreased to a 1 wt % addition, only the dark (tied) phase was detected. There was no indication of a bright (metallic) phase when 1 wt % aluminum was used as the additive. Analysis of the hot pressed bodies made with a 1 wt % aluminum addition revealed total aluminum concentrations of between 1000 ppm and 5000 ppm. Therefore, it appears that adding only 1 wt % aluminum to the silicon carbide powder results in a hot pressed body having a total aluminum concentration of between 1000 ppm and 5000 ppm and which is essentially free of metallic aluminum.

These findings allow for the following general hypothesis. The first 0.5 wt % (or 5000 ppm) of aluminum addition diffuses into the SiC lattice up to the solubility of aluminum therein. Macroscopically, the next about 0.5 wt % of the aluminum combines with the silicon and oxygen atoms available from the 0.5 wt %–2 wt % silica which is usually present as an impurity in silicon carbide and form silicates and aluminates. The next aluminum fraction remains as a metallic constituent in the grain boundary phase, and a fraction thereof evaporates. This hypothesis would explain the continually decreasing detectability of the bright (metallic) phase fraction of aluminum. Simply, as the amount of aluminum additive is decreased, the amount of "overflow" aluminum which must end up as a metallic phase in the grain boundary decreases. When the aluminum additive content is less than 1 wt %, essentially all the aluminum either diffused into the lattice or was tied up by silicon/oxygen atoms, and there is no overflow of bright phase (metallic) aluminum left for a detectable metallic Si phase. Since the diffusive capabilities of the metallic aluminum is much greater than that of the solubized or silicate-tied aluminum, and therefore a much greater concern for potential contamination of the silicon wafers, these findings suggest that the amount of aluminum additive should be kept below about 1 wt % in order to essentially eliminate the troublesome metallic aluminum phase from the dense silicon carbide body. Controlling the aluminum level to prevent a metallic aluminum phase should also reduce contamination of the acid baths which are used to remove LPCVD films from the dummy wafers before reuse.

Moreover, these findings are somewhat at odds with the examination of U.S. Pat. No. 3,836,673 ("Weaver"), which indicated essentially all of the 2 wt % aluminum additive diffuses into the SiC lattice during hot pressing, and so Weaver does not recognize the criticality of controlling the aluminum level to below 1 wt %. However, the analytic tools used by Weaver (including XRD and electron probe) would not be expected to reveal the metallic aluminum compounds at the detection levels required for the present analysis. Moreover, the findings appear to be consistent with the findings of Suzuki, Reports Res. Lab. Asahi Glass Co. Ltd., 36(1) 1986, pp. 25–36, who found similar metallic aluminum phases in silicon carbide bodies having much larger (between 2 wt % and 15 wt %) alumina addition.

Therefore, in preferred embodiment of the present invention, the ceramic wafer consists essentially of at least 90 w/o silicon carbide and between 2000 ppm and 8000 ppm total aluminum, whereby essentially all of the aluminum is present as either:

i) aluminum in the SiC lattice, ii) alumino-silicate compounds, or iii) alumina.

In preferred embodiments, the above wafer is made by densifying a green body comprising ceramic powder, wherein the ceramic powder comprises at least 90 wt % silicon carbide, and between 0.1 wt % and 1 wt % aluminum. In some embodiments, the ceramic powder also comprises between 0.1 and 2 wt % silica, typically present as an impurity on the silicon carbide powder.

It was further found that a certain maximum level iron impurity (about 5 ppm) in the dummy wafer appears to be critical to attaining acceptable levels of iron impurity transfer levels in the neighboring silicon wafers without also providing high temperature acid cleaning. In particular, it was found that dense hot pressed silicon carbide dummy wafers having about 60–70 ppm of Fe adversely contaminated the wafer, while dense hot pressed silicon carbide dummy wafers having about 0.8–1.5 ppm of Fe did not produce significant contamination of adjacent silicon test wafers. In one simulated silicon wafer processing environment wherein the hot pressed silicon carbide wafers (made with 1 wt % aluminum addition) and silicon wafers were exposed to a 900° C. nitrogen environment for three hours, iron contamination of the silicon wafers by the hot pressed silicon carbide wafers having less than 1 ppm Fe was found to be less than $1 \times 10^{10}$ atoms/cm$^2$ (surface measurement). Therefore, these low-iron wafers can be used in 600°–900 ° C. LPCVD processes without having to be hot cleaned or provided with even thin CVD precoats in order to meet the iron contamination surface specification of $10^{10}$ atoms/cm$^2$. In contrast, iron contamination of the silicon wafers by the similar hot pressed silicon carbide wafers having about 60–70 ppm Fe was found to be about $9 \times 10^{10}$ atoms/cm$^2$ (surface measurement) and would be deemed unacceptable by customers in LPCVD applications, as either high temperature cleaning (such as with gaseous DCE or HCl) or thick CVD coating is contemplated as being needed to meet the iron surface contamination specification.

In another simulated silicon wafer processing environment wherein a boat loaded with the hot pressed silicon carbide wafers and silicon wafers was exposed to a 900° C. steam oxidation process, iron contamination of the silicon wafers by the hot pressed silicon carbide wafers (with 2% aluminum addition) having about 1.5 ppm Fe was found to be about $2.88 \times 10^{11}$ atoms/cm$^3$ (bulk measurement) in the silica layer on the silicon wafer. Precoating the dummy wafer with a thin 0.6 um polysilicon CVD layer resulted in an iron concentration of only $9.8 \times 10^{10}$ atoms/cm$^3$ (bulk measurement). Therefore, this dummy wafer was deemed acceptable for oxidation processes in which 850°–900° C. steam is used to oxidize silicon wafers, as only a thin inexpensive CVD layer (which is already typically provided in this process as an etch stop) was required in order to meet the bulk iron specification of $10^{11}$ atoms/cm$^3$. In contrast, iron contamination of the silicon wafers by similar hot pressed silicon carbide wafers having about 60–70 ppm Fe was found to be about $2 \times 10^{12}$ atoms/cm$^3$ (bulk measurement). Precoating the high-iron dummy wafer with a 0.6 um thick polysilicon CVD layer resulted in an iron concentration of about $6 \times 10^{11}$ atoms/cm$^3$ (bulk measurement). Therefore, this high-iron dummy wafer was deemed unacceptable for LPCVD applications, as hot cleaning was contemplated as being needed to meet the bulk iron specification of $10^{11}$ atoms/cm$^3$.

Without wishing to be tied to a theory, it is believed the reason for the low iron transfer in the hot pressed product is as follows. Whereas the iron in a silicon carbide body having open porosity can reach the body surface via the open pore or impregnated silicon avenue, the iron in a silicon carbide body having closed porosity can only reach the surface by diffusion through the silicon carbide lattice or grain boundary phase. Since iron diffuses through the silicon carbide lattice and grain boundary phase at a much slower rate than it can travel through open pores or silicon avenues, the bulk iron content in the closed porosity silicon carbide does not substantially contribute to the transfer problem. That is, only iron which is fairly close to the wafer surface is considered to be a problem.

The realization of the need to control the iron concentration in the closed porosity silicon carbide dummy wafers which have not been hot cleaned is not appreciated by Ezis, who suggested that metallic impurities remain isolated in hot pressed SiC and do not migrate to the SiC surface, but did not recognize the importance of surface iron contamination. Moreover, the ability of the hot pressed silicon carbide dummy wafer to attain the specifications of less than $10^{10}$ atoms Fe/cm$^2$ and/or $10^{11}$ atoms Fe/cm$^3$ by controlling iron content is surprising in light of the Kazakov et al. publication (which taught the general failure of uncoated dense SiC disks), and Tanaka (which taught the necessity of hot cleaning and thick CVD layers).

Preferably, the sintered ceramic wafer of the present invention has a density of at least about 95% of theoretical density, more preferably at least 99% of theoretical density. Its bulk density (as measured by Archimedes method on boules) of at least about 3.05 g/cc, and preferably between 3.15 and 3.21 g/cc. Also preferably, it comprises at least about 90 wt % silicon carbide grains, more preferably at least 95% wt % silicon carbide grains. Preferably, at least 10% of the silicon carbide grains have a diameter of at least 5 um, more preferably at least 15% of the silicon carbide grains have a diameter of at least 5 um. In preferred embodiments, at least 80% of the SiC grains have a diameter of between 0.5 um and 5 um. Its four point flexural strength is usually between about 550 and about 700 MPa. The characteristic strength (as measured by ring-on-ring biaxial flexure) is typically between about 250 MPa and about 600 MPa. Its fracture toughness is usually between about 2.5 and about 3.5 MPa m$^{1/2}$. Its Weibull modulus is generally at least 8, preferably at least 10, more preferably at least 15. Its stiffness is usually between about 400 and about 500 GPa. It likely has between 0.5 and 5 wt % grain boundary phase (preferably between 0.5 and 2 wt % grain boundary phase) and between 0.2 and 2 wt % oxygen, as silica. It is believed that when the oxygen content is so controlled, the grain boundary phase remains crystalline, and the harmful glassy phase thought to possibly be responsible for thermal shock breakage is not formed.

Any silicon carbide powder or precursor thereof commonly used in SiC ceramics may be used in its manufacture. If a powder is used, it is preferably in the alpha form. The silicon carbide powder should contain no more about 50 ppm iron, preferably no more than 10 ppm iron. The surface area of the SiC powder should be between about 6 and about 15 m$^2$/g, and at least about 80% of the SiC particles should have a diameter of between about 0.1 and about 3 microns. In some embodiments, the $D_{50}$ average particle size of the silicon carbide powder is at least 2 microns, preferably at least 3 microns. In preferred embodiments, the SiC powder is E277™-7630, available from the Norton Company in Lillesand, Norway.

In many embodiments, the silicon carbide powder is densified with the help of a sintering aid, preferably a metallic sintering aid. In some of these embodiments, aluminum powder is selected as the sintering aid. Preferably, aluminum is added to the SiC powder to form a blend, wherein the aluminum comprises between 0.25 wt % and 5 wt % of the blend, preferably between about 0.5 wt % and about 1 wt % of the blend. When 1 wt % to 2 wt % aluminum is used as the sintering aid, the resulting silicon carbide ceramics typically comprise between 0.1 wt % and 1 wt % total aluminum, or between about 10% and 50% of the original aluminum fraction added to the blend. Preferably, the aluminum is added by dry blending in order to provide a well-distributed sintering aid. Although aluminum is clearly preferred as the metallic sintering aid, other metallic sintering aids which could be used as substitutes for aluminum may include Mg, Ni, Co, Li, Y, rare earths and B.

Although aluminum nitride could be used as a sintering aid in amounts of between 0.1 wt % to 3 wt % of the blend, its use is not desired, as AlN is believed to form low melting point grain boundary phases with the typical SiC powder impurities, and these low melting point phases make the SiC wafer susceptible to thermal shock. Therefore, in some embodiments, the SiC wafer contains essentially no AlN detectable by XRD.

In some embodiments, alumina could be used as a sintering aid in amounts of between 1 wt % and 3 wt % of the blend. However, it was found that the resulting silicon carbide body had a lower strength than those made with comparable amounts of aluminum.

Although boron is also known as a sintering aid for SiC-based ceramics, its presence in certain diffusion processes has been widely discouraged. Therefore, in some embodiments, the ceramics of the present invention preferably containing less than 0.5 w/o, more preferably less than 0.1 w/o, and most preferably less than 10 ppm boron.

In some embodiments, both a metallic sintering aid and carbon are used together as sintering aids. In preferred embodiments, aluminum is added in an amount of between about 0.25 and about 0.75 w/o, preferably between about 0.4 and about 0.6 w/o of the blend; and carbon is added as an organic resin so that the carbon totals between about 1 and about 2 w/o, and preferably between about 1.3 and about 1.7 w/o, of the blend.

In still other embodiments, carbon is selected as the sole sintering aid. In these embodiments, carbon is added as an organic resin so that the carbon totals between about 1 and about 2 w/o, preferably between about 1.3 and about 1.7 w/o, of the blend.

In order to increase the homogeneity of the powder blend, the aluminum and silicon carbide blend can be milled for between 0.1 hours and 16 hours. In another preferred method of mixing, a metallic sintering aid is introduced as a salt (such as aluminum acetate) which coats the SiC powder. The coating provided by the metallic salt results in a more uniform sintering aid distribution, thereby reducing the amount of metallic sintering aid required. In some embodiments wherein the metallic sintering aid is added as a salt which coats the silicon carbide particles, the amount of sintering aid comprises between about 0.5 wt % and 1 wt % of the blend.

The silicon carbide/sintering aid blends described above are typically densified by hot pressing, although densification by gas pressure sintering in either argon or nitrogen provides comparable results. Preferably, the base technology disclosed in U.S. Pat. No. 3,836,673 (the specification of which is incorporated by reference herein) is used to make the hot pressed silicon carbide boules. Conventional hot pressing soak times (i.e., 0.5 hours to 5 hours, preferably between 0.5 and 2 hours), temperatures (1600° C. to 2100° C., preferably between 1950° C. and 2100° C.), and pressures (20 MPa to 350 MPa, preferably between 20 and 30 MPa) may be used in accordance with the present invention. In one embodiment, a silicon carbide/aluminum blend is poured into a CS-grade graphite sleeve, and then is hot pressed at 2050° C. and 20 MPa for about 0.5 hours.

In one preferred method of making the hot pressed silicon carbide material, a mixture of about 98 wt % Sika IDS SiC powder and about 2 wt % aluminum (atomized, 400 grade, available from Reynolds Corp. of Louisville, Ky.) was dry mixed in a Stephan blender for about six minutes. The blend was then hot pressed in a DAG-coated, graphite mold at 2050° C. until contraction ceases (e.g., for about 30 minutes) at 3000 psi. The resulting density of this material was about 3.2 g/cc.

On another preferred method of making the hot pressed silicon carbide material, a mixture of about 98 wt % Sika IDS SiC powder, 1.5 w/o Varcum resin and about 0.5 wt % aluminum (added as aluminum acetate) was ball milled in a polyurethane mill with SiC media for about 16 hours. After milling, the slurry was passed through 325 and 500 mesh screens and then dried in stainless steel pans. After drying, the powder was calcined at 1200° C. for about 2 hours in an argon atmosphere. Subsequent to this calcination, the powder was de-agglomerated in a Stephan blender for about 6 minutes. The powder was then hot pressed at about 2050° C. and 3000 psi for about 2 hours in a DAG-coated graphite mold. The resulting density of this material was 3.11 g/cc, or 97% of theoretical density.

In yet another preferred method of making the densified silicon carbide ceramics, a mixture of about 98 w/o E277 SiC powder and about 2 w/o aluminum was ball milled in isopropyl alcohol with tungsten carbide media for about 30 hours. After milling, the slurry was passed through 325 and 500 mesh screens and then dried in stainless steel pans. The dried powder cake was de-agglomerated in a Stephan blender for six minutes. The blend was then hot pressed in a DAG-coated, graphite mold at 2035 C. for about 30 minutes at 3000 psi. The resulting density was about 3.35 g/cc, or over 100% of theoretical density, thereby pointing to undesirable tungsten carbide contamination in the ball milling step.

Once the ceramics of the present invention are densified, they are typically sliced into wafers having a thickness of between about 0.3 and 2 mm, typically between about 0.625 mm and 0.75 mm. Slicing is typically done with a wire saw with boron carbide cutting media. The wafers are then ground to the appropriate flatness and smoothness specifications.

When wafer-loaded boats are used in LPCVD processes, they are typically placed in a furnace and exposed to process temperatures of between 600° C. and about 900° C., and often between 600° C. and 800° C. Moreover, the environment typically contains inert gases such as argon and nitrogen, or reactive gases such as oxygen and silanes. In some processes, these conditions serve to deposit polysilicon, silicon nitride or silicon dioxide upon the silicon wafers.

If desired, a highly pure CVD layer may be provided upon the surface of SiC dummy wafers. This CVD player will create a diffusion barrier which inhibits migration of metallic impurities from the wafer to the environment at high temperatures. This typically involves CVD coating the dummy wafer with a high purity impermeable ceramic such as silicon carbide. If CVD coating with silicon carbide is selected, it may be carried out by any conventional CVD SiC method. Likewise, the silicon carbide wafer of the present invention may be CVD coated with a dielectric material such as polycrystalline silicon, silicon nitride, or silicon dioxide. Generally, the thickness of the CVD precoat is between 0.1 and less than 5 um, typically between 0.1 and 1 um, and more typically between 0.1 and 0.5 um.

Hot pressed silicon carbide dummy wafers having diameters of at least 125 um, preferably at least about 150 mm, and more preferably at least about 200 mm; thicknesses of between about 0.3 and about 1 mm, and preferably about between about 0.625 mm and 0.75 mm; flatnesses of between about 25 um and about 150 um, preferably less than about 75 microns; and smoothnesses of less than about 0.5 um Ra, preferably between about 0.2 um and 0.4 um, are obtainable in accordance with this embodiment. It is believed the smoothness range of between 0.2 and 0.4 um is desirable for the superior adherence of films deposited in LPCVD applications, which makes the film less likely to flake off during processing and produce problematic particles.

For the purposes of the present invention, "vol %" refers to a volume percent, and "wt %" refers to a weight percent. The flatness of a wafer is determined by mechanical indentation. The smoothness of a wafer is determined by contact profilometry and presented in terms of arithmetic average Ra. "Boat" includes both horizontal and vertical boats.

EXAMPLE I

This Example shows how to make the wafers of the present invention.

A 2000 g mixture comprising 98 wt % silicon carbide powder S and 2 wt % aluminum powder (400 atomized, from Reynolds Aluminum) were dry blended for five minutes. The aluminum powder had an average particle size of about 4.5 um and contained about 1 wt % alumina impurity. Three silicon carbide powders (Powder S, Powder U, and Powder F) were selected as candidates for making the hot pressed silicon carbide wafers of the present invention. Some of the important features of these powders are provided in Table II below:

TABLE II

| Powder | S | U | F |
|---|---|---|---|
| D90 (um) | 6.23 | 5.62 | 2.19 |
| D50 (um) | 2.09 | 2.02 | 0.97 |
| D10 (um) | 0.29 | 0.35 | 0.28 |
| $SiO_2$ (wt %) | 1.72 | 0.44 | 0.67 |
| total O (wt %) | 1.21 | 0.49 | 0.69 |
| Free C (wt %) | 0.31 | 0.15 | 0.23 |
| iron (ppm) | 300 | 10 | 50 |

The blend was loaded into a 5 inch diameter, ¼ inch thick graphite sleeve inside a graphite dye. The blends were then hot pressed at 2050° C. and 42 tons (3,000 psi or 20 MPa) in an argon atmosphere with a soak period of 30 minutes.

The densified ceramic was then sand blasted to remove the remnants of the graphite sleeve, and the outer diameter was machined to about 150 mm. Six wafers were sliced from the boule with a TOS OD grinder to a thickness of about 1 mm, and then ground with a 150 grit diamond wheel to a thickness of about 0.6 mm. The wafers were then ultrasonically cleaned and etched in an HF/HCL/DI (1:1:4) acid solution (CVD acid) for 60 seconds. After DI rinsing, the wafers were dried under flowing air.

The densities, characteristic strengths, Weibull moduli, and aluminum bulk impurity levels for each of these materials is found in Table III below:

TABLE III

| Hot Pressed Silicon Carbide with 2 wt % Aluminum Addition | | | |
|---|---|---|---|
| | S | U | F |
| Density (g/cc) | 3.20 | 3.19 | 3.21 |
| Strength (MPa) | 325 | 519 | 391 |
| Weibull Modulus | 11.4 | 8.2 | 15.1 |
| Al (bulk ppm) | 9250 | 5950 | 6450 |
| Fe (bulk ppm) | 73 | 1.5 | 24 |
| Ni (bulk ppm) | 18 | 0.3 | 3.4 |
| V (bulk ppm) | 33 | 0.75 | 42 |
| Ti (bulk ppm) | 16 | 3.5 | 12 |
| Cr (bulk ppm) | 5.3 | 0.8 | 2.9 |

As seen from the Table, each material possesses about the same density but the material made from Powder U is much stronger. In addition, it appears to have generally lower levels of metallic impurity. Metallic aluminum could be detected in all of these wafers.

EXAMPLE II

This example examines the level of impurity transfer produced by silicon carbide wafers made from blends having 2 w/o aluminum upon silicon wafers under moderate temperature silicon wafer processing conditions.

Wafers from each of the wafer sets made in Example I were subjected to simulated LPCVD processing conditions in order to determine impurity transfer levels. Hot pressed wafers made as above were placed quartz wafer boats (used to minimize background contamination) which were then placed in a quartz process tube. The wafers made from Powder U were placed farthest upstream while the wafers made from powder S were placed farthest downstream. 125 mm diameter silicon test wafers were placed in the downstream slots adjacent to each of the hot pressed SiC wafers, and silicon control wafers were placed at both the upstream and downstream extremes of the boats. Silicon baffles were also placed in between each test group so as to minimize cross-contamination. The environment was heated to 900° C. under flowing nitrogen and held for 3 hours. The condition is believed to simulate a worst case condition for LP-CVD applications.

The aluminum transfer was evaluated by VPD-GFAA (vapor phase decomposition-graphite furnace atomic absorption), while iron contamination was evaluated by TXRF. One object of this example was to evaluate the levels of iron contamination produced by wafers having different bulk iron concentrations. However, post-test inspection of the loaded boat revealed that it was placed into the test furnace in a manner inconsistent with the directions given to the test facility. Since the dummy wafers were not inscribed with physical markings, there was no guarantee that the individual dummy wafers could be correctly identified as being made from a particular S, U or F powder. Therefore, it was considered appropriate to report the results en masse without ascribing a particular concentration to a particular wafer.

The iron contamination from these wafers were 1.6, 11.2 & $52.5 \times 10^{10}$ atoms Fe/$cm^2$ (surface measurement), respectively, while the aluminum contamination was found to range from $0.87-3.87 \times 10^{11}$ atoms Al/$cm^2$ (surface measurement). Despite the suspected misplacement of the wafers, it is nonetheless fairly strongly believed that the highest iron transfer value was produced by Wafer S (which had an iron concentration of 73 ppm).

Regarding aluminum, although some of these wafers produced low aluminum contamination levels ($0.87 \times 10^{11}$ atoms/$cm^2$) which essentially meet the aluminum transfer specification of $10^{11}$ atoms/$cm^2$, some of the other wafers were somewhat higher (i.e., $3.87 \times 10^{11}$ atoms/$cm^2$). However, it is believed that the higher aluminum levels can be suitably reduced below the $10^{11}$ atoms/$cm^2$ specification simply by precoating the dummy wafer with a thin CVD ceramic layer. Therefore, it appears that providing a thin CVD precoat upon silicon carbide dummy wafers having 5000–10000 ppm total aluminum and detectable metallic aluminum is a necessary and sufficient step for meeting the aluminum specification for aluminum contamination in silicon wafer processing in 600°–900° C. environments. The discovery that mere precoating is all that is required for these wafers to meet the specification is unexpected in light of the art which specifies ppm aluminum levels in porous diffusion components, thick CVD layers in dense SiC diffusion components, and the presence of metallic aluminum in these wafers.

Regarding iron, although none of these wafers (which had no precoat and contained at least 1.5 ppm iron) met the iron transfer specification of $10^{10}$ atoms/$cm^2$, it is believed that the wafers transferring the least amount of iron could be suitably reduced below the $10^{10}$ atoms Fe/$cm^2$ specification simply by precoating the dummy wafer with a thin CVD ceramic layer. However, some of the other wafers transferred much higher levels of iron (i.e., 11.2 & $52.5 \times 10^{10}$ atoms/$cm^2$). These wafers producing high iron contamination of the silicon wafers would be deemed unacceptable by customers in LPCVD applications, as high temperature cleaning (such as with gaseous DCE or HCl) is contemplated as being needed to meet the specification.

These findings related to iron are in conflict with the teaching of Ezis, who suggested that metallic contamination in hot pressed silicon carbide products is present in pockets which are essentially inert to the outside environment, and so did not recognize the influence of surface iron contamination in hot pressed dummy wafers. This finding is also suprising in light of Tanaka, which taught hot cleaning and thick CVD layers.

EXAMPLE IV

This example examines the level of impurity transfer produced by silicon carbide wafers made from blends having 1 wt % aluminum upon silicon wafers under moderate temperature silicon wafer processing conditions.

Hot pressed silicon carbide material was made and then sliced and ground in an manner substantially similar to the process disclosed in Example I above, except the aluminum addition was limited to 1 wt % of the blend.

The densities, characteristic strengths, Weibull moduli, and bulk impurity levels for each of these materials is found in Table IV below:

TABLE IV

Hot Pressed Silicon Carbide with 1 wt % Aluminum Addition

|  | S | U | F |
|---|---|---|---|
| Density (g/cc) | 3.10 | 3.11 | 3.18 |
| Strength, (MPa) | 279 | 317 | 356 |
| Weibull Modulus | 7.9 | 9.9 | 10.8 |
| Al (bulk ppm) | 2300 | 4300 | 6450 |
| Fe (bulk ppm) | 64 | 0.8 | 17 |
| Ni (bulk ppm) | 19 | 0.03 | 1.7 |
| V (bulk ppm) | 37 | 0.24 | 19 |
| Ti (bulk ppm) | 13 | 2.0 | 25 |
| Cr (bulk ppm) | 5.0 | 0.4 | 2.9 |

Although Wafer U had a higher bulk aluminum level than Wafer S, it was surprisingly found that Wafer S had detectable metallic aluminum while Wafer U did not. Wafers from each of these groups were subjected to simulated LPCVD conditions for impurity transfer analysis as described above. The results, provided below in Table V, represents the average of two tests minus the levels found in the upstream control wafer.

TABLE V

|  | S | U | F (broke) |
|---|---|---|---|
| Al ($10^{10}$ atoms/cm$^2$) | 32 | 4.4 | 13.3 |
| Fe ($10^{10}$ atoms/cm$^2$) | 9.0 | <1 | 215 |
| Ni ($10^{10}$ atoms/cm$^2$) | <1 | <1 | 5.7 |
| Na ($10^{10}$ atoms/cm$^2$) | 13 | 0.4 | 8.8 |
| Ti ($10^{10}$ atoms/cm$^2$) | <1 | 1.8 | 2.3 |
| Cr ($10^{10}$ atoms/cm$^2$) | 12.7 | 1 | <1 |

The higher aluminum transfer by Wafer S (in comparison to Wafer U) in spite of its lower total aluminum content suggests that it is more important to eliminate metallic aluminum than to reduce the total aluminum concentration.

Since wafers made from silicon carbide powder S produced high levels of iron contamination, they would likely need hot cleaning in order to insure low iron transfer during processing. Each of the iron and aluminum transfer value made from powder U met the processing specifications of $10^{10}$ atoms Fe/cm$^2$ and $10^{11}$ atoms Al/cm$^2$, respectively. Therefore, it is believed that requiring the iron concentration to be below 1 ppm is critical to producing a dummy wafer which does not even need to be precoated in order to meet the iron transfer specification for some process involving temperatures between 600° C. and 900° C. However, it is believed desirable to precoat the dummy wafer for processes in the range of 850° C. to 900° C. Moreover, it is believed that requiring the aluminum concentration to be below 5000 ppm and that no metallic aluminum be detectable is critical to producing a dummy wafer which does not even need to be precoated in order to meet the iron transfer specification for some process involving temperatures between 600° C. and 900° C.

As noted, wafers made with silicon carbide powder F broke during processing, and so its transfer values were likely compromised by the break. These wafers had higher densities and strengths than the wafers made from powders S and U, but had a lower $D_{90}$ grain size. In particular, wafers made from powder F had a $D_{90}$ grain size of only about 2 um, while the wafers made from powders S and U each had a $D_{90}$ about 5 um. Accordingly, it was concluded that silicon carbide dummy wafers should have a $D_{90}$ of at least 5 um in order to insure their survival during these LPCVD diffusion and oxidation conditions.

EXAMPLE V

This example examines the effect of processes using 900° C. steam.

Wafers made from powders S and U in substantial accordance with Example I above were tested under conditions substantially similar to those described in Example IV, except that the process environment included 900° C. steam for 38 minutes and 900° C. nitrogen for 20 minutes. Run 1 included a wet cleaning; Run 2 included precoating the dummy wafers with a 6000 Angstrom layer of polysilicon; and Run 3 included a further cleaning of the precoated dummy wafer by 1050° C. DCE for 2 hours and 1050° C. HCl for 1.5 hours. The technique used was SPV and the results are reported in Table VI in terms of a bulk iron concentration, and so the applicable goal is $10^{11}$ atoms Fe/cm$^3$.

TABLE VI

Iron Transfer ($10^{11}$ atoms Fe/cm$^3$)

| Run | Cleaning | Wafer S | Wafer U |
|---|---|---|---|
| 1 | wet | 20 | 2.8 |
| 2 | 6k poly dep | 6 | 0.98 |
| 3 | hot DCE | 0.4 | 1.2 |

It can be observed that in each case, the 0.6 um precoat layer of polysilicon effectively reduced the iron contamination by about a factor of three. The use of such a thin precoat as a means of reducing the metallic contaminant transfer is not known in the art.

Wafer U would likely be deemed acceptable by customers in LPCVD applications, as the conventional thin precoat of polysilicon is all that is believed to be needed to meet the iron specification for processes involving 850° C. to 900° C. steam. In contrast, the higher iron contamination of the silicon wafers by the hot pressed silicon carbide wafers S would be deemed unacceptable by customers in LPCVD applications, as high temperature cleaning (such as with gaseous DCE or HCl) was necessary to meet the specification. Moreover, as shown in Run 2, simply adding a silicon nitride precoat fails to adequately reduce the transfer level to below the iron specification for Wafer S. Therefore, it is believed that requiring the iron concentration to be below 2 ppm and providing a precoat are critical to producing a dummy wafer which meets the iron transfer specification in applications involving 850°–900° C. steam.

EXAMPLE VI

This example examines the effect of process temperatures no more than 850° C.

Wafers made from powders S and U in substantial accordance with Example I above were tested under conditions substantially similar to those described in Example I, except that the process environment was steam at 800° C. for what was believed to be about 30 minutes. Wafers were subjected to wet cleaning, and were not precoated. The technique used was MCLT and the results are reported in Table VII in terms of microseconds, wherein higher values correspond to less transfer.

TABLE VII

Minority carrier lifetimes ($10^{-6}$ sec)

|  | Average | Std. Dev. | Max | Min |
|---|---|---|---|---|
| Si control | 135 | 35 | 225 | 25 |
| Wafer U | 125 | 33 | 195 | 30 |
| Wafer S | 96 | 27 | 185 | 35 |

As seen from Table VIII, the wafers made from powder U perform almost as well as dummy silicon wafers, as its average transfer value is well within one standard deviation of the average transfer value of the silicon dummy wafer. In contrast, the average transfer value of Wafer S is more than one standard deviation of the average transfer value of the silicon dummy wafer.

Moreover, since the performance specification for this application is an average of at least 100 $10^{-6}$ seconds, Wafer U easily met the specification while wafer S failed. Therefore, it is believed that requiring the iron concentration to be below about 5 ppm without providing a precoat is critical to producing a dummy wafer which meets the iron transfer specification in LPCVD or oxidation applications in environments of between about 600° C. and 850° C. If desired however, a precoat may be used.

The above Examples can be summarized as follows:

| | Iron | | |
|---|---|---|---|
| Iron Concen. | 900° C. $N_2$ | 900° C. steam/$N_2$ | 800° C. steam |
| 73/64 ppm | Fail | Fail | Fail |
| 1.5 ppm | ? | Precoat pass | Pass |
| 0.8 ppm | Pass | No test | No test |

| | Aluminum | | |
|---|---|---|---|
| Al Conc. (ppm) | Metallic Al | 900° C. $N_2$ | 800° C. Steam |
| 5950 | Yes | Precoat pass | Pass |
| 6450 | Yes | Precoat pass | No test |
| 9250 | Yes | Precoat pass | ? |
| 4600 | No | Pass | No test |
| 2300 | Yes | Precoat pass | No test |

We claim:

1. A method of using a silicon carbide ceramic wafer in the treatment of silicon wafers, comprising the steps of:
   a) providing a wafer boat having a plurality of slots configured for the insertion of wafers, a first slot having a silicon wafer inserted therein, a second slot having a silicon carbide dummy wafer inserted therein, the silicon carbide dummy wafer having a thickness of between about 0.3 mm and about 1.0 mm, a diameter of at least 125 mm, closed porosity, a $D_{90}$ grain size of at least 5 um, a Weibull modulus of at least 8, and a density of at least about 90% of theoretical density, and comprising:
      i) at least about 90 wt % silicon carbide grains, wherein at least 80 wt % of the silicon carbide grains have a diameter of between 0.5 and 5 um,
      ii) less than 5 wt % free silicon, and
   b) exposing the loaded boat to an environment having a temperature of between 300° C. and 900° C. for at least 0.5 hours.

2. The method of claim 1 wherein the environment has a temperature of between 600° C. and 900° C., and the diameter of the silicon carbide dummy wafer is at least 150 mm.

3. The method of claim 2 wherein the Weibull modulus is at least 10.

4. The method of claim 2 wherein the silicon carbide dummy wafer has a characteristic strength of between 250 MPa and 600 MPa.

5. The method of claim 3 wherein the total exposure is between 10 and 100 hours.

6. The method of claim 2 wherein at least 10% of the silicon carbide grains have a diameter of at least 5 um.

7. A method of using a silicon carbide dummy ceramic wafer in the treatment of silicon wafers, comprising the steps of:
   a) providing a wafer boat having a plurality of slots configured for the insertion of wafers, a first slot having a silicon wafer inserted therein, a second slot having the silicon carbide dummy wafer inserted therein, the silicon carbide dummy wafer having a thickness of between about 0.3 mm and about 1.0 mm, closed porosity, and a density of at least about 90% of theoretical density, and comprising:
      i) at least about 90 wt % silicon carbide grains,
      ii) less than 5 wt % free silicon, and
      iii) an iron impurity content of between 1.5 ppm and no more than 5 ppm,
   b) exposing the loaded boat to an environment having a temperature of between 300° C. and 900° C. for at least 0.5 hours,
   wherein step b) is performed without prior treatment of the silicon carbide dummy wafer by a gaseous cleaning fluid at temperatures of at least 1000° C., and
   wherein the silicon carbide dummy wafer is substantially free of a CVD layer having a thickness of at least 5 um at the beginning of step b).

8. The method of claim 7 wherein step b) is performed without prior treatment of the silicon carbide dummy wafer by a gaseous cleaning fluid at temperatures of at least 1000° C.

9. The method of claim 8 wherein the silicon carbide dummy wafer is substantially free of a CVD layer having a thickness of at least 5 um at the beginning of step b), and wherein the environment has a temperature of between 600° C. and 900° C.

10. The method of claim 7 wherein the iron impurity content is between 1.5 ppm and about 2 ppm, a precoat of CVD ceramic having a thickness of between 0.1 and less than 5 um is applied to the silicon carbide dummy wafer prior to step b), and the environment has a temperature of 850° C. to 900° C.

11. A method of using a silicon carbide dummy ceramic wafer in the treatment of silicon wafers, comprising the steps of:

a) providing a wafer boat having a plurality of slots configured for the insertion of wafers, a first slot having a silicon wafer inserted therein, a second slot having the silicon carbide dummy wafer inserted therein, the silicon carbide dummy wafer having a thickness of between about 0.3 mm and about 1.0 mm, closed porosity, and a density of between 97% and 100% of theoretical density, and comprising:
   i) at least about 99 wt % silicon carbide grains,
   ii) less than 5 wt % free silicon, and
   iii) an iron impurity content of no more than 1 ppm,
b) exposing the loaded boat to an environment having a temperature of between 600° C. and 900 ° C. for at least 0.5 hours, wherein step b) is performed without prior treatment of the silicon carbide dummy wafer by a gaseous cleaning fluid at temperatures of at least 1000° C., and wherein the silicon carbide dummy wafer is substantially free of a CVD layer having a thickness of at least 5 um at the beginning of step b).

12. The method of claim 11 wherein no precoat of CVD ceramic having a thickness of between 0.1 and less than 5 um is applied to the silicon carbide dummy wafer prior to step b).

13. The method of claim 7 wherein no precoat of CVD ceramic is applied to the silicon carbide dummy wafer prior to step b), the iron impurity content is between 1.5 ppm and 5 ppm, and the environment has a temperature of no more than 850° C.

14. The method of claim 7 wherein a precoat of CVD ceramic having a thickness of between 0.1 and less than 5 um is applied to the silicon carbide dummy wafer prior to step b), the iron impurity content is between 1.5 ppm and 5 ppm, and the environment has a temperature of no more than 850° C.

15. The method of claim 11 wherein the ceramic wafer has a density of at least 99% of theoretical density.

16. A method of using a silicon carbide ceramic wafer in the treatment of silicon wafers, comprising the steps of:
   a) providing a wafer boat having a plurality of slots configured for the insertion of wafers, a first slots having a silicon wafer inserted therein, a second slot having a silicon carbide dummy wafer inserted therein, the silicon carbide dummy wafer having a thickness of between about 0.3 mm and about 1.0 mm, closed porosity, and a density of at least about 90% of theoretical density, and comprising:
      i) at least about 90 wt % silicon carbide grains,
      ii) less than 5 wt % free silicon,
      iii) an aluminum content characterized by either:
         between about 5000 ppm and about 10,000 ppm total bulk aluminum (as detected by GDMS), and comprising metallic aluminum in an amount detectable by EDS, or
         between about 1000 ppm and about 5,000 ppm total bulk aluminum, the essential absence of metallic aluminum, as determined by EDS, and less than 500 ppm nitrogen,
   b) exposing the wafer boat to an environment having a temperature of between 300° C. and 900° C. for at least 0.5 hours, wherein step b) is performed without prior treatment of the silicon carbide dummy wafer by a gaseous cleaning fluid at temperatures of at least 1000° C., and wherein the silicon carbide dummy wafer is substantially free of a CVD layer having a thickness of at least 5 um prior to step b).

17. The method of claim 16 wherein step b) is performed without prior treatment of the silicon carbide dummy wafer by a gaseous cleaning fluid at temperatures of at least 1000° C.

18. The method of claim 17 wherein the silicon carbide dummy wafer is substantially free of a CVD layer having a thickness of at least 5 um prior to step b).

19. The method of claim 18 wherein the environment has a temperature of between 600° C. and 900° C.

20. The method of claim 19 wherein the aluminum content is characterized by between about 1000 ppm and about 5,000 ppm total bulk aluminum, the essential absence of metallic aluminum, as determined by EDS, and less than 500 ppm nitrogen, and no precoat of CVD ceramic is applied to the silicon carbide dummy wafer prior to step b).

21. The method of claim 19 wherein the aluminum content is characterized by between about 5000 ppm and about 10,000 ppm total bulk aluminum (as detected by GDMS), and comprising metallic aluminum in an amount detectable by EDS, and a 0.1–5 um precoat of CVD ceramic is applied to the silicon carbide dummy wafer prior to step b).

22. The method of claim 16 wherein no precoat of CVD ceramic is applied to the silicon carbide dummy wafer prior to step b), and the environment comprises a temperature of no more than 850° C.

23. The method of claim 22 wherein the aluminum content is characterized by between about 5000 ppm and about 10,000 ppm total bulk aluminum (as detected by GDMS), and comprising metallic aluminum in an amount detectable by EDS.

24. The method of claim 16 wherein the aluminum content is characterized by between about 1000 ppm and about 5,000 ppm total bulk aluminum, the essential absence of metallic aluminum, as determined by EDS, and less than 500 ppm nitrogen.

25. The method of claim 16 wherein step b) includes the step of depositing a CVD layer of a polysilicon upon the silicon carbide dummy wafer having metallic aluminum therein, the deposition proceeding at a temperature of no more than about 825° C., so that the rate of deposition of the CVD layer exceeds the rate of diffusion of aluminum impurities in the silicon carbide dummy wafer from the surface of the dummy wafer through the CVD layer being deposited thereon.

26. The method of claim 22 wherein the environment has a temperature of between 600° C. and 900° C.

27. The method of claim 24 wherein the environment has a temperature of between 600° C. and 900° C.

28. The method of claim 25 wherein the environment has a temperature of between 600° C. and 900° C.

29. A sintered ceramic wafer having less than 5 wt % free silicon, a thickness of between about 0.5 mm and about 1.0 mm, a diameter of at least 125 mm, a density of at least about 90% of theoretical density, and closed porosity, the wafer comprising at least about 90 wt % silicon carbide grains, a Weibull modulus of at least 8, and a $D_{90}$ SiC grain size of at least 5 um, wherein at least 80 wt % of the SiC grains having a diameter of between 0.5 and 5 um.

30. The wafer of claim 29 having a characteristic strength of between 250 and 600 MPa.

31. The wafer of claim 29 having a toughness of between about 2.5 and 3.5 MPa m$^{1/2}$.

32. The wafer of claim 29 wherein the Weibull modulus of at least 10.

33. The wafer of claim 29 having a 0.1–5 um thick coating of a dielectric ceramic thereon.

34. The wafer of claim 29 comprising at least 99% silicon carbide grains, and having a density of between 97–100% of theoretical density.

35. The wafer of claim 29 further comprising an aluminum content characterized by between about 5000 ppm and about 10,000 ppm total bulk aluminum (as detected by GDMS), and comprising metallic aluminum in an amount detectable by EDS.

36. The wafer of claim 29 further comprising an aluminum content characterized by between about 1000 ppm and about 5,000 ppm total bulk aluminum, the essential absence of metallic aluminum, as determined by EDS, and less than 500 ppm nitrogen.

37. A sintered ceramic wafer having less than 5 wt % free silicon, a thickness of between about 0.3 mm and 1.0 mm, a density of at least about 90% of theoretical density, and closed porosity, the wafer comprising at least about 90 wt % silicon carbide grains and having an iron impurity content of between 1.5 ppm and less than about 5 ppm, wherein the wafer is substantially free of a CVD layer having a thickness of at least 5 um.

38. The ceramic of claim 37 wherein the ceramic wafer further comprises an aluminum content characterized by between about 5000 ppm and about 10,000 ppm total bulk aluminum (as detected by GDMS), and comprising metallic aluminum in an amount detectable by EDS.

39. The ceramic of claim 37 wherein the ceramic wafer further comprises an aluminum content characterized by between about 1000 ppm and about 5,000 ppm total bulk aluminum, the essential absence of metallic aluminum, as determined by EDS, and less than 500 ppm nitrogen.

40. The ceramic wafer of claim 37 having a 0.1–5 um thick coating of a dielectric ceramic thereon.

41. The ceramic wafer of claim 37 having an iron impurity content of between 1.5 ppm and less than about 2 ppm, and a 0.1–5 um thick coating of a dielectric ceramic thereon.

42. The ceramic wafer of claim 37 having no precoat thereon.

43. A sintered ceramic wafer having less than 5 wt % free silicon, a thickness of between about 0.3 mm and 1.0 mm, a density of between 97–100% of theoretical density, and closed porosity, the wafer comprising at least about 99 wt % silicon carbide grains and having an iron impurity content of no more than 1 ppm.

44. The ceramic wafer of claim 43 having no precoat thereon.

45. The ceramic wafer of claim 43 having a density of at least 99% of theoretical density.

46. A sintered ceramic wafer having less than 5 wt % free silicon, a thickness of between about 0.5 mm and 1.0 mm, a density of at least about 90% of theoretical density, and closed porosity, the wafer comprising at least about 90 wt % silicon carbide grains and having an aluminum content characterized by either:

between about 5000 ppm and about 10,000 ppm total bulk aluminum (as detected by GDMS), and comprising metallic aluminum in an amount detectable by EDS, or between about 1000 ppm and about 5,000 ppm total bulk aluminum, the essential absence of metallic aluminum, as determined by EDS, and less than 500 ppm nitrogen.

47. The ceramic wafer of claim 46 having a 0.1–5 um thick coating of a dielectric ceramic thereon.

48. The wafer of claim 46 having an aluminum content characterized by between about 5000 ppm and about 10,000 ppm total bulk aluminum (as detected by GDMS), and comprising metallic aluminum in an amount detectable by EDS.

49. The wafer of claim 46 having an aluminum content characterized by between about 1000 ppm and about 5,000 ppm total bulk aluminum, the essential absence of metallic aluminum, as determined by EDS, and less than 500 ppm nitrogen.

* * * * *